United States Patent
Park et al.

(10) Patent No.: US 9,234,925 B2
(45) Date of Patent: Jan. 12, 2016

(54) APPARATUS AND METHOD FOR MEASURING DIELECTRIC CONSTANT

(71) Applicant: Korea Advanced Institute of Science and Technology, Daejeon (KR)

(72) Inventors: Seong-Ook Park, Daejeon (KR); Byeong Yong Park, Daejeon (KR); Myung Hun Jeong, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 255 days.

(21) Appl. No.: 13/913,558

(22) Filed: Jun. 10, 2013

(65) Prior Publication Data

US 2014/0361791 A1 Dec. 11, 2014

(51) Int. Cl.
*G01R 27/04* (2006.01)
*G01R 27/26* (2006.01)

(52) U.S. Cl.
CPC ................... *G01R 27/2658* (2013.01)

(58) Field of Classification Search
CPC ....... G01N 22/00; G01N 22/04; G01N 15/12; G01N 15/227; G01N 15/1218; G01R 27/04
See application file for complete search history.

(56) References Cited

U.S. PATENT DOCUMENTS

| | | | | |
|---|---|---|---|---|
| 3,684,952 A | * | 8/1972 | Lundstrom | 324/667 |
| 6,496,018 B1 | * | 12/2002 | Nagata et al. | 324/636 |
| 2004/0246079 A1 | * | 12/2004 | Ehata | 333/219.2 |
| 2005/0093555 A1 | * | 5/2005 | Ehata | 324/672 |

* cited by examiner

*Primary Examiner* — Tung X Nguyen
*Assistant Examiner* — Dominic Hawkins
(74) *Attorney, Agent, or Firm* — Hammer & Associates, P.C.

(57) ABSTRACT

Provided are an apparatus and method for measuring a dielectric constant. The apparatus includes a cavity resonator including a cavity therein, an insertion hole penetrating through the cavity vertically and in which a sample is inserted, and grooves symmetrically formed with respect to the cavity in the insertion hole, a network analyzer configured to generate an electromagnetic signal supplied to the cavity resonator, receive an electromagnetic signal passed through the cavity resonator, and calculate a scattering parameter, a transmission means configured to supply the generated electromagnetic signal to the cavity resonator, a reception means configured to supply the electromagnetic signal passed through the cavity resonator to the network analyzer, and a calculation processor configured to receive the scattering parameter from the network analyzer and calculate a dielectric constant of the sample.

7 Claims, 8 Drawing Sheets

APPARATUS AND METHOD FOR MEASURING DIELECTRIC CONSTANT

BACKGROUND

1. Field of the Invention

The present invention relates to an apparatus and method for measuring a dielectric constant, and more particularly, to an apparatus and method for measuring a dielectric constant by inserting a sample into a cavity resonator.

2. Discussion of Related Art

With the acceleration in the developmental progression of various microwave devices, it is necessary to measure a dielectric constant that is an electrical property of a material more accurately and reliably in the microwave band.

In addition, a problem with a material production process may cause a problem with the uniformity of the dielectric constant of the material, and thus a test for the uniformity of the dielectric constant of a material is also needed.

A method of measuring a dielectric constant using a cavity resonator is widely used.

A cavity resonator is in the form of a conductor surrounding a cavity, and is used in a wavemeter, a filter, measurement of a permittivity or a permeability in the microwave band, etc. using the resonance of the cavity.

In particular, a method of measuring the permittivity and permeability of a material in the microwave band using a cavity resonator is referred to as a cavity perturbation method.

In the cavity perturbation method, a sample to be measured is inserted into a resonator, and its permittivity and permeability are measured from a resonant frequency shift and the variance of a quality factor before and after the insertion of the sample.

Such a cavity perturbation method involves inducing a very little perturbation in the cavity resonator, and thus a dielectric to be measured should be processed to have a diameter of about 2Φ in X-band(8~12.5 GHz).

In addition, when the diameter of an insertion hole is formed to be large to insert a dielectric into a cavity resonator without processing the dielectric, an electromagnetic signal leaks through the insertion hole.

SUMMARY OF THE INVENTION

The present invention is directed to providing an apparatus and method for measuring a dielectric constant capable of measuring a dielectric constant of a dielectric without breaking the dielectric and leaking an electromagnetic signal.

One aspect of the present invention provides an apparatus for measuring a dielectric constant including: a cavity resonator including a cavity therein, an insertion hole penetrating through the cavity vertically and in which a sample is inserted, and grooves symmetrically formed with respect to the cavity in the insertion hole; a network analyzer configured to generate an electromagnetic signal supplied to the cavity resonator, receives an electromagnetic signal passed through the cavity resonator, and calculates a scattering parameter; a transmission means configured to supply the generated electromagnetic signal to the cavity resonator; a reception means configured to supply the electromagnetic signal passed through the cavity resonator to the network analyzer; and a calculation processor configured to the scattering parameter from the network analyzer, and calculate a dielectric constant of the sample.

The grooves may be cavity structures formed to surround the insertion hole with a predetermined height.

A length of the sample may be longer than a distance between the pair of grooves.

Another aspect of the present invention provides a method of measuring a dielectric constant using the apparatus for measuring a dielectric constant, the method including: preparing at least two reference samples whose dielectric constants are known and a measurement sample whose dielectric constant will be measured; measuring resonant frequencies and quality factors of the reference samples; completing a dielectric constant formula of the cavity resonator on the basis of the dielectric constants of the reference samples and the measured resonant frequencies and quality factors of the reference samples; measuring a resonant frequency and a quality factor of the measurement sample; and calculating the dielectric constant of the measurement sample by inserting the measured resonant frequency and quality factor of the measurement sample into the dielectric constant formula.

The resonant frequencies and the quality factors may be measured with the reference samples and the measurement sample disposed to cover a gap between the pair of grooves.

The method may further include changing a position of the measurement sample in the insertion hole to calculate the dielectric constants, and comparing the calculated dielectric constants with each other to find uniformity of the dielectric constants of the measurement sample.

The dielectric constant of the measurement sample may be calculated using the following equations:

$$\frac{f - f_0}{f} = \frac{-\int_{V_s}(\varepsilon'_r - 1)\varepsilon_0 \overline{E} \cdot \overline{E}^o_0 dv}{\int_{V_o}(\varepsilon_o \overline{E} \cdot \overline{E}^o_0 + \mu_0 \overline{H} \cdot \overline{H}^o_0)dv} = -(\varepsilon'_r - 1)A$$

$$\frac{1}{2}\left(\frac{1}{Q} - \frac{1}{Q_0}\right) = \frac{\int_{V_s}\varepsilon''_r \varepsilon_0 \overline{E} \cdot \overline{E}^o_0 dv}{\int_{V_o}(\varepsilon_o \overline{E} \cdot \overline{E}^o_0 + \mu_0 \overline{H} \cdot \overline{H}^o_0)dv} = \varepsilon''_r B$$

where $\omega = 2\pi f$, $\delta\omega = \omega - \omega_0$, $\omega_0 = 2\pi f_0$, $\overline{E}''_0$, and $\overline{H}''_0$ denote electromagnetic fields before sample insertion, $\overline{E}$ and $\overline{H}$ denote electromagnetic fields after the sample insertion, $\epsilon_r$ denotes a permittivity of a sample, f denotes a resonant frequency after the sample is inserted into the cavity resonator, $f_0$ denotes a resonant frequency of the cavity resonator itself before the sample insertion, $\epsilon_0$ denotes a permittivity of free space ($8.854 \times 10^{-12}$ F/m) and $\mu_0$ denotes a permeability of free space ($4\pi \times 10^{-7}$ H/m).

Completing the dielectric constant formula of the cavity resonator may include approximating the equations as $(n-1)^{th}$-degree polynomials using the n reference samples whose dielectric constants are known, and calculating A and B.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

Unless otherwise defined, all terms including technical and scientific terms used herein are to be interpreted as is customary in the art to which this invention belongs. It will be further understood that terms in common usage should also be interpreted as is customary in the relevant art and not in an idealized or overly formal sense unless expressly so defined herein.

With reference to the appended drawings, exemplary embodiments of the present invention will be described in detail below. Like numbers refer to like elements or elements corresponding to each other throughout the description of the figures, and the description of the same elements will not be reiterated.

Figure 1:
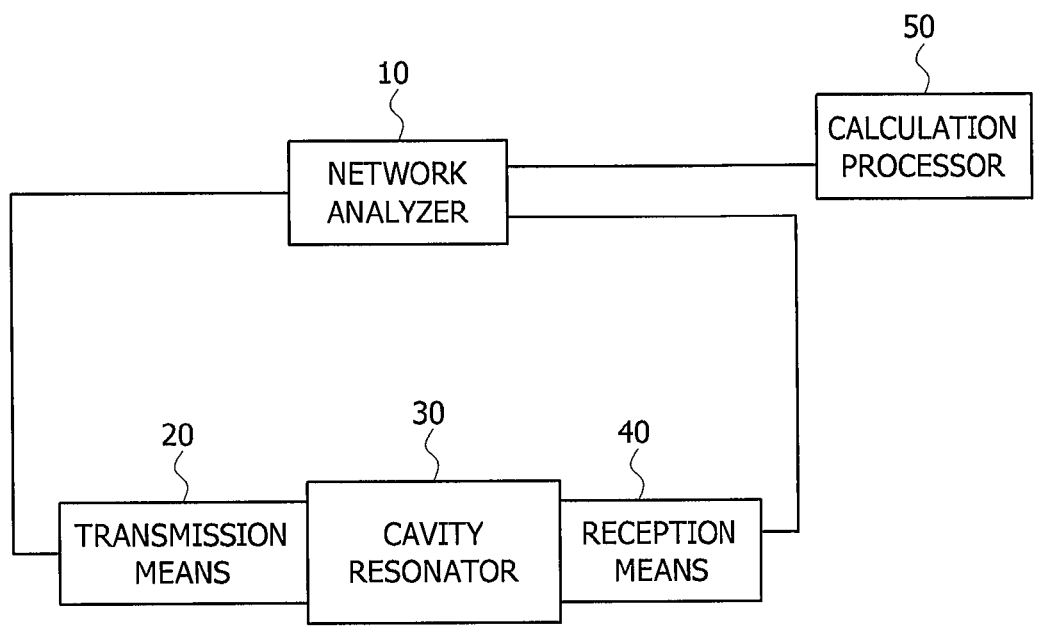
FIG. 1 is a block diagram of an apparatus for measuring a dielectric constant according to an exemplary embodiment of the present invention.

FIG. 1 is a block diagram of an apparatus for measuring a dielectric constant according to an exemplary embodiment of the present invention.

Referring to FIG. 1, an apparatus for measuring a dielectric constant according to an exemplary embodiment of the present invention includes a network analyzer 10, a transmission means 20, a cavity resonator 30, a reception means 40, and a calculation processor 50.

The network analyzer 10 generates and supplies an electromagnetic signal having a frequency to be measured to the cavity resonator 30, and calculates a scattering parameter from the amount of the electromagnetic signal passed through the cavity resonator 30 and the amount of the electromagnetic signal reflected by the cavity resonator 30.

The transmission means 20 applies the electromagnetic signal supplied from the network analyzer 10 to the cavity resonator 30, and the reception means 40 transfers an electromagnetic signal passed through the cavity resonator 30 to the network analyzer 10.

The transmission means 20 and the reception means 40 may be connected with the network analyzer 10 through a coaxial cable, and function as a coaxial-to-waveguide adaptor.

One end of the cavity resonator 30 is connected with the transmission means 20, and the other end is connected with the reception means 40. Thus, the cavity resonator 30 receives the electromagnetic signal from the network analyzer 10 and also transmits the electromagnetic signal caused to resonate therein to the network analyzer 10. Here, the cavity resonator 30 may include coupling holes (not shown) on both sides to exchange the electromagnetic signals between the transmission means 20 and the reception means 40.

Figure 2:
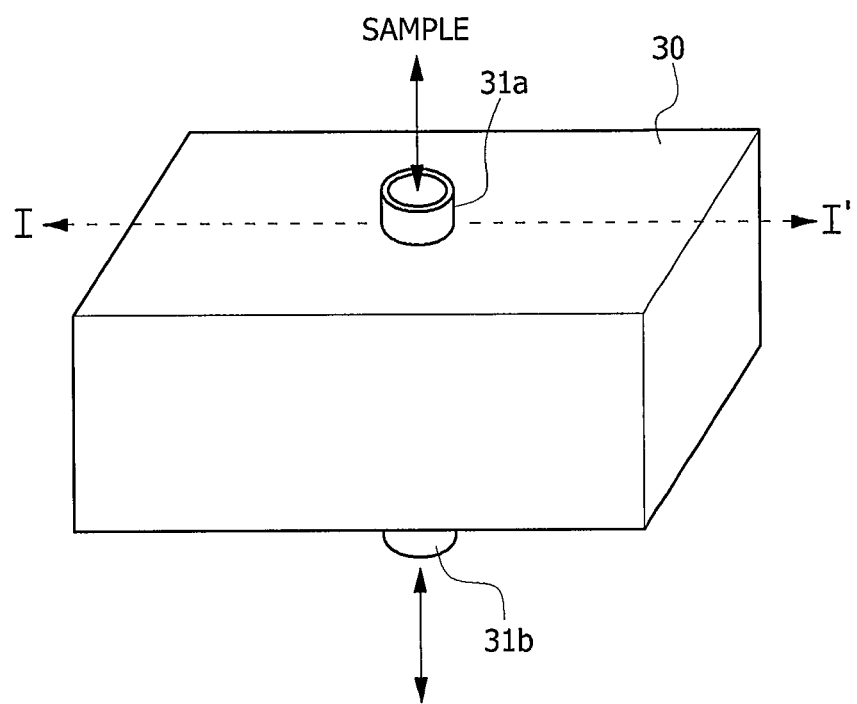
FIG. 2 is a perspective view of a cavity resonator.
Figure 3:
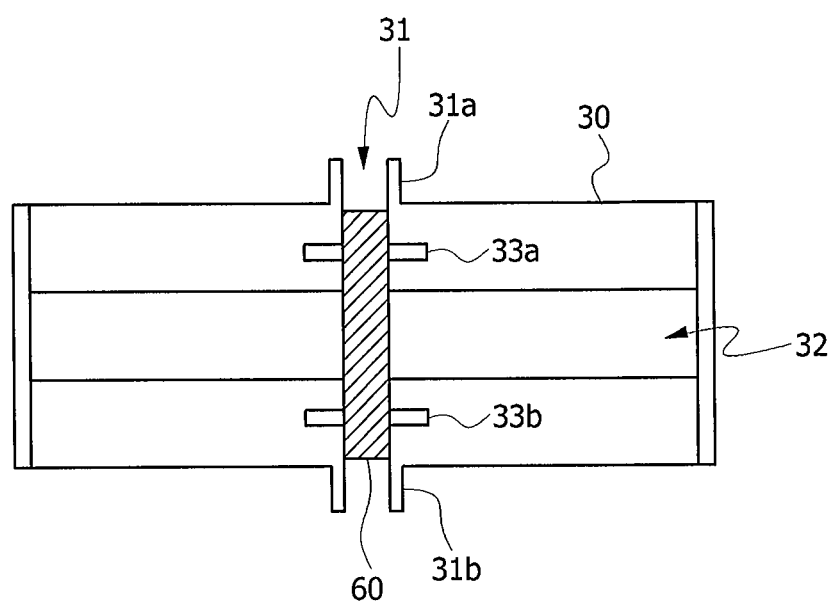
FIG. 3 is a cross-sectional view of a cavity resonator.
Figure 4:
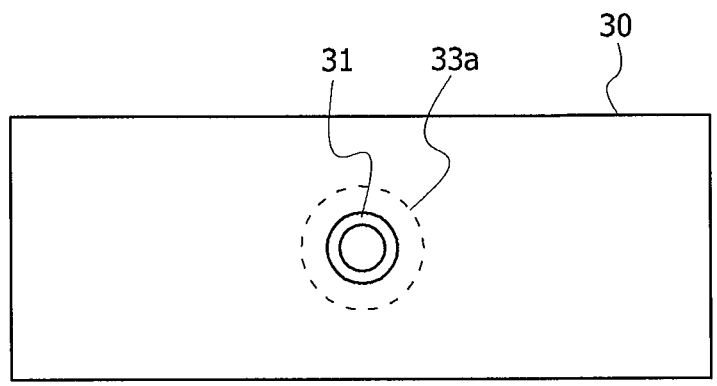
FIG. 4 is a top-down view of a cavity resonator.

FIG. 2 to FIG. 4 are drawings showing the cavity resonator 30 in further detail. FIG. 2 is a perspective side view of the cavity resonator 30, FIG. 3 is a cross-sectional view of the cavity resonator 30, and FIG. 4 is a top-down view of the cavity resonator 30.

Referring to FIG. 2 to FIG. 4, the cavity resonator 30 includes a cavity 32 therein, and includes an insertion hole 31 penetrating through the cavity 32 vertically so that a sample 60 can be inserted into the cavity resonator 30.

The cavity resonator 30 is designed to resonate in a frequency band to be measured, and the insertion hole 31 may be formed at the maximum electric field point of the cavity resonator 30.

Since the sample 60 that is a dielectric serves as a transmission line of an electromagnetic line or an antenna in the cavity resonator 30, there is a probability that an electromagnetic signal will leak out of the insertion hole 31 through the sample 60.

To solve this problem, the cavity resonator 30 according to an exemplary embodiment of the present invention may further include at least one pair of grooves 33a and 33b symmetrically formed with respect to the cavity 32 in the insertion hole 31.

The grooves 33a and 33b are formed as cavity structures formed to surround the insertion hole 31 with a predetermined height.

These grooves 33a and 33b are leaky-wave suppression structures that prevent an electromagnetic signal from leaking out of the insertion hole 31 along the sample 60 that is a dielectric, and function as radio frequency (RF) chokes that set an electric field region in the grooves 33a and 33b.

Thus, to prevent a leaky wave upon insertion of the sample 60, the length of the sample 60 may be longer than the distance between the grooves 33a and 33b. In other words, for the electric field region-limiting effect of the grooves 33a and 33b, the sample 60 may be disposed to cover the gap between the pair of grooves 33a and 33b as shown in FIG. 3.

Also, another cavity resonator 30 according to an exemplary embodiment of the present invention may further include a positioner (not shown) for adjusting and fixing the position of the sample 60.

A plurality of pairs of grooves may be disposed at predetermined intervals, and when the plurality of pairs of grooves are formed, the signal-blocking characteristic may be further improved.

When the plurality of pairs of grooves are formed, the length of the sample 60 may be longer than the distance between outermost grooves.

Meanwhile, as shown in the exemplary embodiment of FIG. 2 to FIG. 4, the cavity resonator 30 may further include insertion guides 31a and 31b around the insertion hole 31 to facilitate insertion of the sample 60 into the insertion hole 31.

Although the cavity resonator 30 has a cuboid shape, and the sample 60, the insertion hole 31, and the grooves 33a and 33b have cylindrical shapes in the exemplary embodiment of FIG. 2 to FIG. 4, these may be formed in different shapes according to embodiments.

The calculation processor 50 receives a scattering parameter from the network analyzer 10, and calculates a dielectric constant and uniformity of the sample 60.

Figure 5:
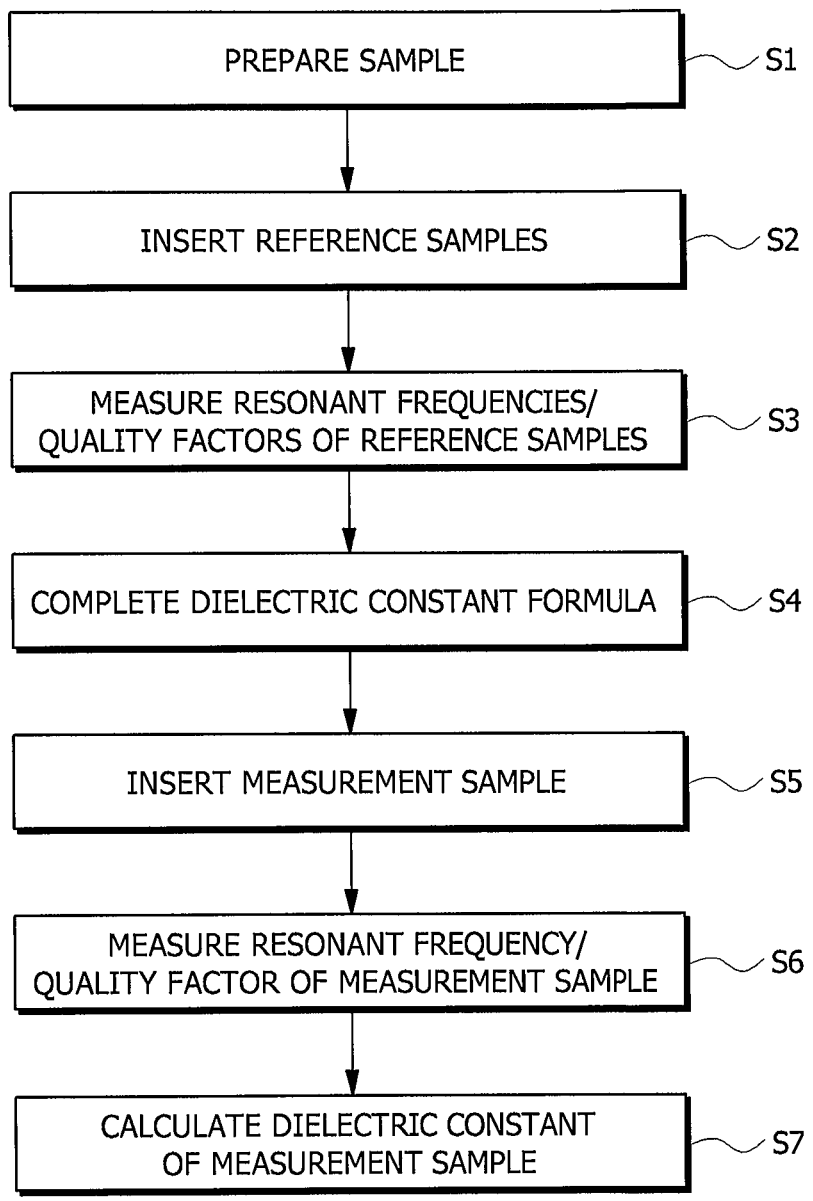
FIG. 5 is a flowchart illustrating a method of measuring a dielectric constant using an apparatus for measuring a dielectric constant according to an exemplary embodiment of the present invention.

FIG. 5 is a flowchart illustrating a method of measuring a dielectric constant using an apparatus for measuring a dielectric constant according to an exemplary embodiment of the present invention. A method of measuring a dielectric constant will be described below with reference to an experimental example performed according to an exemplary embodiment of the present invention.

First, samples are prepared (S1).

Here, the samples include at least two reference samples whose dielectric constants are known and a measurement sample whose dielectric constant will be measured. The reference samples are prepared to complete a dielectric constant formula according to characteristics of the cavity resonator 30. As the reference samples, dielectrics having dielectric constants similar to an expected dielectric constant of the measurement sample may be preferred.

Samples used in this experiment are shown in Table 1 below.

TABLE 1

| MCT-16 | Cavity Perturbation Method (2Φ) | | Present Invention (7.6Φ) | | |
|---|---|---|---|---|---|
| | Real Part | Imaginary Part | | Real Part | Imaginary Part |
| 1 | 16.6835 | 0.0011 | Ref | 16.6835 | 0.0011 |
| 2 | 16.5992 | 0.0014 | Ref | 16.5992 | 0.0014 |
| 3 | 16.5857 | 0.0012 | | 16.6069 | 0.0012 |
| | | | Δε | −0.0212 | 0 |
| 4 | 16.6431 | 0.0014 | | 16.6222 | 0.0011 |
| | | | Δε | 0.0209 | 0.0003 |
| 5 | 16.6127 | 0.0013 | | 16.6528 | 0.0014 |
| | | | Δε | −0.0401 | −0.0001 |

In Table 1, 1 and 2 denote reference samples, and 3, 4, and 5 denote measurement samples.

In this experiment, dielectric constants measured after samples were processed to have a diameter of 2Φ according to the existing cavity perturbation method were compared with dielectric constants measured without breaking the samples having a diameter of 7.6Φ according to an exemplary embodiment of the present invention.

As the samples, MCT-16 from Magnetron Co. was used, and the dielectric constant of these MCT-16 samples can have an error range of ±5% due to their production process. Meanwhile, a resonant frequency set for the cavity resonator 30 itself was 9.3734 GHz.

Next, the reference samples are inserted into the cavity resonator 30 (S2), and resonant frequencies and quality factors of the inserted reference samples are measured (S3).

In this experiment, a resonant frequency and quality factor of sample 1 were measured to be 8.7773 GHz and 1522.2 respectively, and a resonant frequency and quality factor of sample 2 were measured to be 8.7786 GHz and 1509.2 respectively.

A dielectric constant formula of the cavity resonator 30 is completed on the basis of the measured resonant frequencies and quality factors of the reference samples and the already-known dielectric constants of the reference samples (S4).

The process of completing a dielectric constant formula (S4) will be described in further detail below.

$$\frac{\delta\omega}{\omega} = \frac{-\int_{V_s}(\varepsilon_r - 1)\varepsilon_0 \overline{E} \cdot \overline{E}_0^o dv}{\int_{V_o}(\varepsilon_o \overline{E} \cdot \overline{E}_0^o + \mu_0 \overline{H} \cdot \overline{H}_0^o)dv}$$ [Equation 1]

$$= \frac{-\int_{V_s}((\varepsilon_r' - j\varepsilon_r'') - 1)\varepsilon_0 \overline{E} \cdot \overline{E}_0^o dv}{\int_{V_o}(\varepsilon_o \overline{E} \cdot \overline{E}_0^o + \mu_0 \overline{H} \cdot \overline{H}_0^o)dv}$$

$$\approx \frac{f - f_0}{f} + \frac{j}{2}\left(\frac{1}{Q} - \frac{1}{Q_0}\right)$$

Here, $\omega = 2\pi f$, $\delta\omega = \omega - \omega_0$, $\omega_0 = 2\pi f_0$, $\overline{E}''_0$, and $\overline{H}''_0$ denote electromagnetic fields before sample insertion, $\overline{E}$ and $\overline{H}$ denote electromagnetic fields after sample insertion, $\varepsilon_r$ denotes a permittivity of a sample, f denotes a resonant frequency after the sample is inserted into the cavity resonator 30, $f_0$ denotes a resonant frequency of the cavity resonator 30 itself before the sample insertion, $\varepsilon_0$ denotes a permittivity of free space ($8.854 \times 10^{-12}$ F/m) and $\mu_0$ denotes a permeability of free space ($4\pi \times 10^{-7}$ H/m).

Equation 1 above may be split into Equations 2 and 3 below.

$$\frac{f - f_0}{f} = \frac{-\int_{V_s}(\varepsilon_r' - 1)\varepsilon_0 \overline{E} \cdot \overline{E}_0^o dv}{\int_{V_o}(\varepsilon_o \overline{E} \cdot \overline{E}_0^o + \mu_0 \overline{H} \cdot \overline{H}_0^o)dv} = -(\varepsilon_r' - 1)A$$ [Equation 2]

$$\frac{1}{2}\left(\frac{1}{Q} - \frac{1}{Q_0}\right) = \frac{\int_{V_s}\varepsilon_r''\varepsilon_0 \overline{E} \cdot \overline{E}_0^o dv}{\int_{V_o}(\varepsilon_o \overline{E} \cdot \overline{E}_0^o + \mu_0 \overline{H} \cdot \overline{H}_0^o)dv} = \varepsilon_r''B$$ [Equation 3]

Using the reference samples, a real constant A stated in Equation 2 and an imaginary constant B stated in Equation 3 are calculated.

Since two reference samples are used in the exemplary embodiment of the present invention, real constants $(A_1, A_2)$ and imaginary constants $(B_1, B_2)$ are calculated as Equation 4 below.

$$-\frac{(8.7773 - 9.3734)}{8.7773(16.6835 - 1)} = 0.00433047 = A_1$$ [Equation 4]

$$-\frac{(8.7786 - 9.3734)}{8.7786(16.5992 - 1)} = 0.00434315 = A_2$$

$$\frac{1}{2}\left(\frac{1}{1522.2} - \frac{1}{1582.2}\right)\frac{1}{0.0011} = 0.0111667 = B_1$$

$$\frac{1}{2}\left(\frac{1}{1509.2} - \frac{1}{1582.2}\right)\frac{1}{0.0014} = 0.0107143 = B_2$$

By performing linear interpolation assuming that a resonant frequency detected from one reference sample is $x_1$, and the calculated real constant A is $y_1$, and performing linear interpolation assuming that a resonant frequency detected from the other reference sample is $x_2$, and the calculated imaginary constant B is $y_2$, it is possible to obtain linear equations as Equation 5 below.

Here, since the two reference samples were used in this example, linear interpolation was performed. However, when multiple reference samples are used to reduce an error, it is possible to approximate the equations as (the number of the reference samples—1)$^{th}$-degree polynomials.

$$(9.2218 \times 10^{-12}) \cdot x1 - 0.0766 = y1$$

$$(3.48739 \times 10^{-5}) \cdot x2 - 0.0419 = y2 \quad \text{[Equation 5]}$$

Accordingly, a dielectric constant formula is completed. After that, a measurement sample is inserted (S5), and a resonant frequency and a quality factor of the measurement sample are measured (S6).

Although it has been described in this exemplary embodiment that a measurement sample is inserted after the formula is completed by inserting reference samples, it is possible to complete the formula after measuring resonant frequencies and quality factors of the reference samples and the measurement sample.

A measured resonant frequency and quality factor of sample 3 were 8.7785 GHz and 1517.4, respectively.

Subsequently, a dielectric constant of the measurement sample is calculated on the basis of the measured resonant frequency and quality factor of the measurement sample and the completed formula (S7).

When the measured resonant frequency and quality factor of the measurement sample are inserted into Equation 5 obtained through the interpolation, the real constant A and the imaginary constant B are calculated as Equation 6 below.

$$(9.2218 \times 10^{-12}) \cdot 8.7785 \times 10^9 - 0.0766 = 0.004341999 = A$$

$$(3.48739 \times 10^{-5}) \cdot 1517.4 - 0.0419 = 0.01100086 = B \quad \text{[Equation 6]}$$

When the real constant A and the imaginary constant B calculated from Equation 6, and the measured resonant frequency and quality factor are inserted into Equation 2, it is possible to calculate the dielectric constant as Equation 7 below.

$$1 + \frac{(8.7785 \times 10^9 - 9.3734 \times 10^9)}{8.7785 \times 10^9 \cdot 0.004341999} = \quad \text{[Equation 7]}$$

$$16.6069 = \varepsilon'_{r,\text{Measurement target}}$$

$$\frac{1}{2}\left(\frac{1}{1517.4} - \frac{1}{1582.2}\right)\frac{1}{0.01100086} =$$

$$0.0012 = \varepsilon''_{r,\text{Measurement target}}$$

The real part of the dielectric constant of sample 3 measured using the method of measuring a dielectric constant according to an exemplary embodiment of the present invention is 16.6069. Referring to Table 1, it is possible to check that the value has a very small error of −0.0212 (0.128%) from 16.5857 according to the existing cavity perturbation method, and the imaginary part has no error.

Detailed calculation processes of samples 4 and 5 will be omitted. Referring to the results in Table 1, it is possible to know that there are very small errors in the real parts and the imaginary parts of samples 4 and 5 in comparison with those of the existing cavity perturbation method.

Figure 6A:
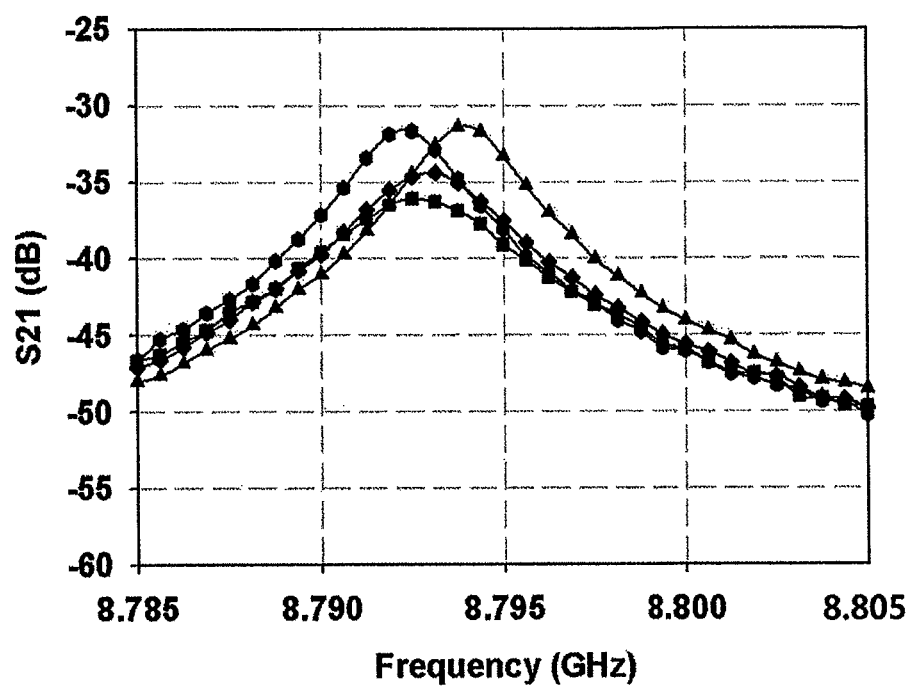
FIG. 6A is a graph showing a frequency response characteristic according to a sample position when there is no groove structure.
Figure 6B:
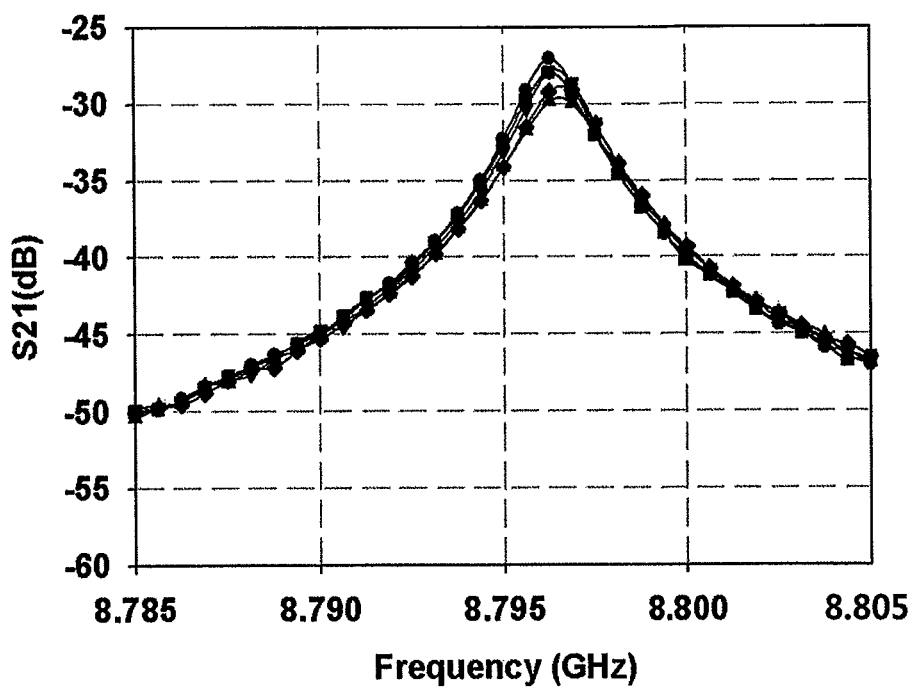
FIG. 6B is a graph showing a frequency response characteristic according to a sample position when a groove structure is formed.

FIG. 6A is a graph showing a frequency response characteristic according to a sample position when there is no groove structure, and FIG. 6B is a graph showing a frequency response characteristic according to a sample position when a groove structure is formed.

Referring to FIG. 6A, it is possible to know that leakage of an electromagnetic signal occurs according to a sample position, and a frequency response characteristic varies. On the other hand, referring to FIG. 6B, it is possible to know that a groove structure performs the function of an RF choke, and the frequency response characteristic is uniform even when a sample position varies.

Figure 7:
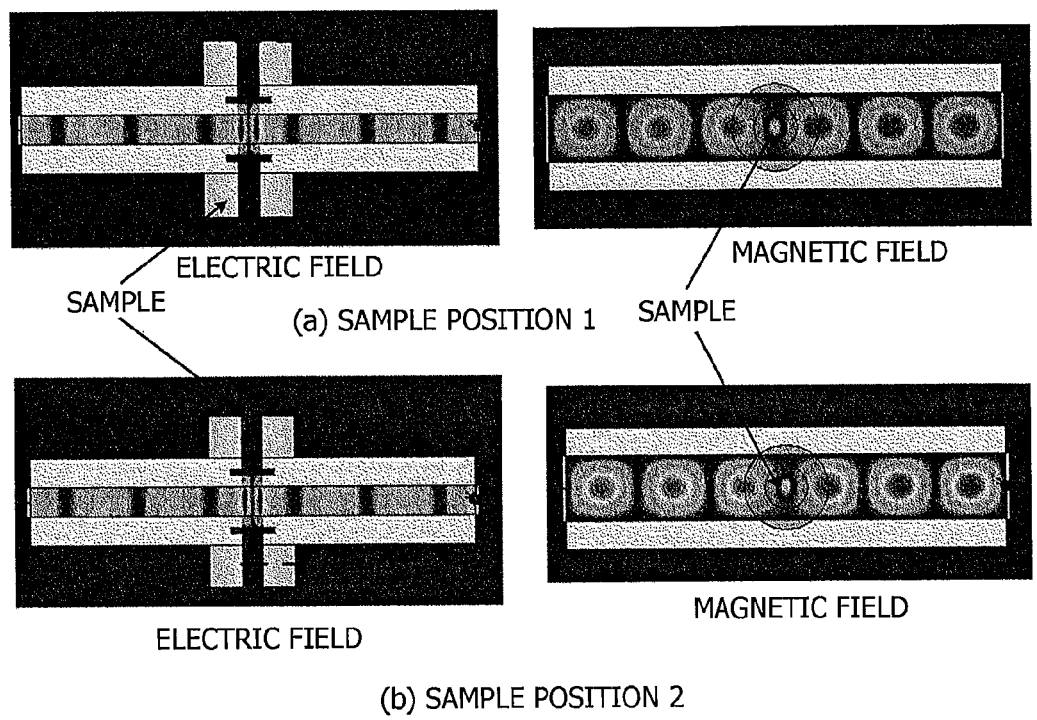
FIG. 7 shows diagrams illustrating an electric and a magnetic field according to a sample position.

FIG. 7 shows diagrams illustrating an electric and a magnetic field according to a sample position. Left diagrams are side views of magnetic fields, and right diagrams are top-down views of electric fields.

As shown in FIG. 7, when a dielectric constant is measured using an apparatus and method for measuring a dielectric constant according to an exemplary embodiment of the present invention, even if the position of a sample varies, a part of the sample located outside the grooves 33a and 33b has no effect on forming of an electric field and magnetic field in the cavity resonator 30.

In this embodiment, a sample is disposed to cover the gap between the grooves 33a and 33b as shown in FIG. 3, and thus the reliability of a dielectric constant can be ensured even when the position of the sample varies.

Consequently, it is possible to find the uniformity of dielectric constants of the sample using a method of measuring a dielectric constant according to an exemplary embodiment of the present invention. In other words, when the sample is disposed to cover the gap between the grooves 33a and 33b, the position of the sample is changed to measure dielectric constants, and the uniformity of the dielectric constants of the sample can be found by comparing the measured dielectric constants with each other.

In an exemplary embodiment of the present invention, grooves are formed in an insertion hole of a cavity resonator to prevent leakage of an electromagnetic signal, so that the dielectric constant of a dielectric can be nondestructively measured with no limitation on the length or diameter of the dielectric.

Also, in an exemplary embodiment of the present invention, an electric field region is formed by grooves. Thus, the position of a dielectric is changed to cover a gap between a pair of grooves, and dielectric constants are measured at various positions, so that the uniformity of the dielectric constants of the dielectric can be found.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus for measuring a dielectric constant, comprising:
   a cavity resonator including a cavity therein, an insertion hole penetrating through the cavity vertically and in which a sample is inserted, and grooves symmetrically formed with respect to the cavity in the insertion hole;

a network analyzer configured to generate an electromagnetic signal supplied to the cavity resonator, receive an electromagnetic signal passed through the cavity resonator, and calculate a scattering parameter;

a transmission means configured to supply the generated electromagnetic signal to the cavity resonator;

a reception means configured to supply the electromagnetic signal passed through the cavity resonator to the network analyzer; and a calculation processor configured to receive the scattering parameter from the network analyzer, and calculate a dielectric constant of the sample;

wherein the calculation processor calculates the dielectric constant of the sample using the following equations:

$$\frac{f - f_0}{f} = \frac{-\int_{V_s} (\varepsilon'_r - 1)\varepsilon_0 \overline{E} \cdot \overline{E}_0^o \, dv}{\int_{V_o} (\varepsilon_o \overline{E} \cdot \overline{E}_0^o + \mu_0 \overline{H} \cdot \overline{H}_0^o) dv} = -(\varepsilon'_r - 1)A$$

$$\frac{1}{2}\left(\frac{1}{Q} - \frac{1}{Q_0}\right) = \frac{\int_{V_s} \varepsilon''_r \varepsilon_0 \overline{E} \cdot \overline{E}_0^o \, dv}{\int_{V_o} (\varepsilon_o \overline{E} \cdot \overline{E}_0^o + \mu_0 \overline{H} \cdot \overline{H}_0^o) dv} = \varepsilon''_r B$$

where $\omega=2\pi f$, $\delta\omega=\omega-\omega_0$, $\omega_0=2\pi f_0$, $\overline{E}''_0$ and $\overline{H}''_0$ denote electromagnetic fields before sample insertion, $\overline{E}$ and $\overline{H}$ denote electromagnetic fields after the sample insertion, $\epsilon_r$ denotes a dielectric constant of the sample, f denotes a resonant frequency after the sample is inserted in the cavity resonator, $f_0$ denotes a resonant frequency of the cavity resonator before the sample insertion, $\epsilon_0$ denotes a dielectric constant of free space (8.854×10–12 F/m), and $\mu_0$ denotes a permeability of free space ($4\pi \times 10^{-7}$ H/m).

2. The apparatus of claim 1, wherein the grooves are cavity structures formed to surround the insertion hole with a predetermined height.

3. The apparatus of claim 1, wherein a length of the sample is longer than a distance between the grooves.

4. A method of measuring a dielectric constant using the apparatus of claim 1, comprising:

preparing at least two reference samples whose dielectric constants are known and a measurement sample whose dielectric constant will be measured;

measuring resonant frequencies and quality factors of the reference samples;

completing a dielectric constant formula of the cavity resonator on the basis of the dielectric constants of the reference samples and the measured resonant frequencies and quality factors of the reference samples;

measuring a resonant frequency and a quality factor of the measurement sample; and calculating the dielectric constant of the measurement sample by inserting the measured resonant frequency and quality factor of the measurement sample into the dielectric constant formula, wherein the dielectric constant of the measurement sample is calculated using the following equations:

$$\frac{f - f_0}{f} = \frac{-\int_{V_s} (\varepsilon'_r - 1)\varepsilon_0 \overline{E} \cdot \overline{E}_0^o \, dv}{\int_{V_o} (\varepsilon_o \overline{E} \cdot \overline{E}_0^o + \mu_0 \overline{H} \cdot \overline{H}_0^o) dv} = -(\varepsilon'_r - 1)A$$

$$\frac{1}{2}\left(\frac{1}{Q} - \frac{1}{Q_0}\right) = \frac{\int_{V_s} \varepsilon''_r \varepsilon_0 \overline{E} \cdot \overline{E}_0^o \, dv}{\int_{V_o} (\varepsilon_o \overline{E} \cdot \overline{E}_0^o + \mu_0 \overline{H} \cdot \overline{H}_0^o) dv} = \varepsilon''_r B$$

where $\omega=2\pi f$, $\delta\omega=\omega-\omega_0$, $\omega_0=2\pi f_0$, $\overline{E}''_0$ and $\overline{H}''_0$ denote electromagnetic fields before sample insertion, $\overline{E}$ and $\overline{H}$ denote electromagnetic fields after the sample insertion, $\epsilon_r$ denotes a dielectric constant of the sample, f denotes a resonant frequency after the sample is inserted in the cavity resonator, $f_0$ denotes a resonant frequency of the cavity resonator before the sample insertion, $\epsilon_0$ denotes a dielectric constant of free space (8.854×10–12 F/m), and $\mu_0$ denotes a permeability of free space ($4\pi \times 10^{-7}$ H/m).

5. The method of claim 4, wherein the resonant frequencies and the quality parameters are measured with the reference samples and the measurement sample disposed to cover a gap between the pair of grooves.

6. The method of claim 5, further comprising changing a position of the measurement sample in the insertion hole to calculate the dielectric constants, and comparing the calculated dielectric constants with each other to find uniformity of the dielectric constants of the measurement sample.

7. The method of claim 4, wherein completing the dielectric constant formula of the cavity resonator includes approximating the equations as (n−1)th-degree polynomials using the n reference samples whose dielectric constants are known, and calculating A and B.

* * * * *